US 6,715,107 B2

(12) United States Patent
Beer et al.

(10) Patent No.: US 6,715,107 B2
(45) Date of Patent: Mar. 30, 2004

(54) METHOD AND SYSTEM FOR REDUCING THE COMPUTATION TREE TO INCLUDE ONLY MODEL BEHAVIORS DEFINED SUCCINCTLY BY A USER VIA REGULAR EXPRESSIONS AS BEING OF INTEREST

(75) Inventors: Ilan Beer, Haifa (IL); Dana Fisman, Holon (IL); Leonid Gluhovsky, Haifa (IL); Tali Yatzhar-Haham, Haifa (IL)

(73) Assignee: International Business Machines Corporation, Armonk, NY (US)

( * ) Notice: Subject to any disclaimer, the term of this patent is extended or adjusted under 35 U.S.C. 154(b) by 624 days.

(21) Appl. No.: 09/746,695

(22) Filed: Dec. 26, 2000

(65) Prior Publication Data

US 2002/0124208 A1 Sep. 5, 2002

(51) Int. Cl.$^7$ ................................................. G06F 11/00
(52) U.S. Cl. ............................................. 714/37; 703/2
(58) Field of Search ............................. 714/37, 38, 48, 714/51, 26; 703/2, 13, 15, 27

(56) References Cited

U.S. PATENT DOCUMENTS

| 6,102,959 | A | * | 8/2000 | Hardin et al. ................... 703/2 |
| 6,141,633 | A | * | 10/2000 | Iwashita et al. ............... 703/15 |
| 6,163,876 | A | * | 12/2000 | Ashar et al. .................... 716/5 |
| 6,484,134 | B1 | * | 11/2002 | Hoskote ....................... 703/14 |

OTHER PUBLICATIONS

Beer, Ilan et al., "On-the-Fly Model Checking of RCTL Formulas", Congress of Computer Aided Verification, Canada, 1998.
Clarke, Edmund et al., "Model Checking", The MIT Press, Cambridge, MA, London England, 1999, pp. 1–11,35–41, 109–120.
Hopcroft, John E. et al., "Introduction to Automata Theory, Languages and Computations," Addison Wesley, New York, 1979, pp. 13–35.
Kaufmann, Matt et al., "Design Contraints in Symbolic Model Checking," CAV '98, LNCS 1427, Canada 1998.
McMillan, Kenneth L., "Symbolic Model Checking", Kluwer Academic Publishers, Massachusetts, 1993. 1–31.
Piper, Lisa J., "Verifying an Ethernet MAC Transmitter Using FormalCheck," The Verification Times, Jun. 1998.
De Palma, Gary, Getting the Most from a Model Checker, The Verification Times, Jun. 1998.
Roman, Carlos, Writing Queries for Formal Check, The Verification Times, Jun. 1998.
Emmit, John, "Formal Check Version 1.1", The Verification Times, Jun. 1998.

\* cited by examiner

*Primary Examiner*—Nadeem Iqbal
(74) *Attorney, Agent, or Firm*—Browdy and Neimark, P.L.L.C.

(57) ABSTRACT

The invention implements a novel method for discarding model behaviors from the computation-tree, when these behaviors are defined by the user as 'not interesting'. The method works as follows: the user defines, by declarative means via regular expression, a set of model behaviors that are of interest. After applying this method, referred to as the restrict algorithm henceforth, the computation-tree will consist only of paths representing model behaviors specified by the user. The restrict algorithm consists of a preprocessing stage and a processing stage. In the preprocessing stage, a mechanism for identifying when an execution path is an allowed behavior is constructed. While processing, sub-trees representing "bad behaviors" (execution paths identified as not allowed behaviors) are pruned from the computation-tree.

11 Claims, 3 Drawing Sheets

METHOD AND SYSTEM FOR REDUCING THE COMPUTATION TREE TO INCLUDE ONLY MODEL BEHAVIORS DEFINED SUCCINCTLY BY A USER VIA REGULAR EXPRESSIONS AS BEING OF INTEREST

FIELD OF THE INVENTION

This invention relates in general to model checking and, in particular, to model reduction techniques embedded in computer-implemented model checking.

REFERENCES

—Ilan Beer, Shoham Ben-David, Avner Landver—"*On-The-Fly Model Checking of RCTL Formulas*", Computer Aided Verification, CAV '98, LNCS 1427 Canada, 1998.

—Edmund M Clarke, Orna Grumberg, Doron Peled—"*Model Checking*", The MIT Press, Cambridge, Massachusetts London England, 1999 pp. 1–11.

—Hopcroft John E, Ullrnan Jeffrey D—"*Introduction to Automata Theory, Languages and Computations*", Addison Wesley, New York, 1979.

—Matt Kaufmann, Andrew Martin, Carl Pixley—"*Design Constraints in Symbolic Model Checking*", CAV '98, LNCS 1427 Canada, 1998.

—Kenneth L. McMillan—"*Symbolic Model Checking*", Kluwer Academic Publishers, Massachusetts, 1993.

BACKGROUND OF THE INVENTION

When designing systems that can be modeled as Finite State Machines, tools are used to check the correctness of the final design with respect to a design specification before proceeding to mass-production. A formal verfication tool is usually a computer program which requires as input a mathematical model of the system and a specification of desired design criteria. Thus, for example, in an integrated circuit including combinatorial gates and memory elements the circuit may generate an acknowledge signal (ACK) in response to a request signal (REQ) and the design specification may require that the REQ signal will be followed by the ACK signal within three clock cycles.

From a knowledge of the design specification and the mathematical model of the integrated circuit, a computer program can determine whether the model meets the specified design criteria. In the "temporal logic model checking" approach for formal verification, specifications are usually expressed in a propositional temporal logic, and circuit designs and protocols are modeled as state-transitions systems. An efficient search procedure is then used to determine if the specification holds on the state-transition system. In other words, a computer program checks whether the state-transition system is a model for the specification [CGP].

This approach suffers from the state-explosion problem. That is, the size of the state-space of the model is exponential in the number of its state-variables. Since the search procedure explores the state-space, its complexity is exponential in the number of state-variables as well. Thus the size of the designs which can be verified by model checking, using given computer resources such as memory and processing capacity, is severely limited.

Hence automated means to reduce the state-space are extremely important for making the technique of model checking tractable for industrial size designs.

A reduction is a procedure that reduces the state-space, while preserving anti-validity of the formula (i.e. if a propositional temporal logic formula is not valid in the reduced model it is also not valid in the original model). Naturally, the more the reduction can cut off the state-space, the better its merit will be. A natural way to reduce the state-space is to limit the behaviors of the environment. Since the model is comprised of the design under verification and its environment, reduction of the state space can be achieved by way of restricting the environment.

One traditionally used method for writing environment models is describing them via a Finite State Machine (FSM). Another way, used by Carl Pixley [KMP] is to specify environment models as a collection of Boolean constraints. In this approach, all inputs of the design under test are left free, but in the course of reachability analysis the model-checker discards all states that violate any of the user-specified Boolean constraints.

Other tools [FormalCheck(TM), CVE(TM)] enable the user to describe models via temporal constraints.

This invention introduces an innovative way to describe models (and in particular environment models), using regular expressions.

TABLE I

| | Definitions |
|---|---|
| Computation-tree | a representation of all possible executions of some finite-state machine in a form of an infinite tree. A branch in the tree corresponds to a specific execution path starting at the initial state (which is represented by the root of the tree). |
| Depth of a state | The minimal number of iterations required to explore the state, starting at the initial set of states. |
| Design Under Verification | the hardware design to be verified. |
| Environment | a description of the possible legal behaviors of the input pins of the design under verification possibly represented by a state-transition system. |
| Formula | a property of the design under verification written in RCTL [BBL]. |
| Language of a Regular Expression | the set of strings defined by a regular expression. |
| Model | the design under verification plus its environment. |
| Model checking | a method of formal verification [CGP]. |
| RCTL | a logic used for specifying properties of the design under verification [BBL]. |
| Regular Expression | an expression constructed by inductive application of the operations 'concatenation', 'or' and 'Kleene closure' on a set of Boolean expressions [HU]. |
| Rule | a model and a set of formulas claiming some properties regarding the model. |
| State | a valuation of all state-variables. |
| State variable | the model checker's representation of a memory element. |
| State-space | the set of all possible states. |
| Symbolic model checking | a method of model checking which partially solves the state explosion problem [CGP]. |

THE PROBLEM

It is therefore straightforward that the user desires a reduction, which removes all paths that do not lead to any of the behaviors he aims at verifying. Intuitively, the user would wish to guide the search to error-prone areas of the design, while completely disregarding the rest. However, with the existing methods for model description, mainly by deployment of finite state machines (FSMs), the user might find it difficult to manipulate the model in such a manner so that scenarios of interest, and only scenarios of interest, occur.

Loosely speaking, it would be desirable to give the user the ability to describe, with minimum effort (specifically without the need for FSM implementation), a restricted model, in which the state-space includes only paths specified by her to be of interest. Such a reduced state space model would be amenable to analysis using a smaller memory than the complete state-space model and would be analyzed more quickly for a given computer processing capacity.

SUMMARY OF THE INVENTION

It is thus an object of the invention to restrict the computaion-tree to include only model behaviors described by the user (via the regular expression) as interesting.

This object is realized in accordance with a first aspect of the invention by a computer-implemented method for pruning a computation-tree defining a set of model behaviors of a state machine to a subset of the model behaviors, thereby reducing a size of the computation-tree and allowing analysis thereof by a computer in a shorter calculation time than would be possible for the complete computation-tree, said method comprising the steps of:

(a) obtaining as input:
  i) a mathematical model of a Finite State Machine, and
  ii) a Regular Expression defining a set of behaviors that are of interest to the user,
(b) using the Regular Expression to construct:
  i) a finite automaton accepting all prefixes of words accepted by the Regular Expression, and
  ii) a Boolean expression that realizes a property that the state is part of some path of a behavior defined by the Regular Expression, i.e. the expression evaluates to a first logic symbol for each of said words that are defined by the Regular Expression and evaluates to a second logic symbol otherwise, and
(c) exploring a state space of a product machine comprising the Finite State Machine and the constructed finite automaton such that for each state of the product machine there exists a corresponding Finite State Machine component and a corresponding finite automaton component, and for each explored state of the product machine, if the finite automaton component of a currently explored state of the product machine does not satisfy the Boolean Expression, then:
(d) pruning the currently explored state from the computation tree so as to abort further exploration from the currently explored state.

To achieve this goal, the user is required to declare the set of desired behaviors, by means of a regular expression. The restrict algorithm aims at removing all sub-trees of the computation-tree that correspond to undesired behaviors. This task requires the ability to identify when an execution path is one of the desired behaviors—a task which is also embedded as part of the algorithm.

The restrict algorithm according to the invention offers what is believed to be an improved way of specifying models—by regular expressions, which constrain the paths to be considered by the model checker. This method is a generalization of the Boolean constraint method and can be used together with the FSM method. The generalization is due to the fact that while the Boolean constraints method discards 'bad states', this method discards 'bad finite computations'.

Although conceptually the invention is associated with a computation-tree, what is actually manipulated is a finite state machine and its underlying state-space. Traversing this space induces a computation-tree, where each state that is reached constitutes a root of the sub-tree of all possible future continuations of this computation. The operation of pruning a sub-tree is implemented as omission of the state representing the root of this sub-tree. Thus, instead of realizing a mechanism that identifies paths corresponding to allowed behaviors, the invention implements a mechanism for identifying states (in the computation-tree) that are part of (at least) one of the desired behaviors.

The identification mechanism (constructed during the preprocessing stage) consists of a non-deterministic finite automaton (NFA), accepting the language of all prefixes of the regular expression, describing the desired behaviors. This NFA is denoted as a satellite. A path u is a prefix of a regular expression if it is in the language of the regular expression or if a path starting by u and followed by v is in the language of the regular expression. Hence, we can say that the accepting satellite-states capture the property until now, the execution did not 'misbehave' while the rejecting satellite-states capture the property the execution 'misbehaved'.

In the processing stage, the states of a product machine comprising the Finite State Machine and the constructed NTA are explored. States of the product machine are comprised of two components, one corresponding to the Finite State Machine component and the other corresponding to the constructed NFA. When a state is explored, if the NFA component of the currently explored state of the product machine does not satisfy the Boolean Expression, then it is discarded by the search algorithm (as if it was not explored). The fact that the NFA component of the currently explored state does not satisfy the regular expression indicates that the Finite State Machine has rendered into a state that does not participate in any of the allowed behaviors (according to Regular Expression). Any state that can be explored from this state onwards, will not be a part of any of the allowed behaviors as well. Hence, ignoring the state (as if it was not explored) implements pruning from the computation tree a sub-tree whose root is the point in which the Finite State Machine "misbehaved", i.e. does not obey any of the allowed behaviors. This procedure results in a reduced state-space, representing a computation-tree containing all and only paths corresponding to allowed behaviors.

BRIEF DESCRIPTION OF THE DRAWINGS

In order to understand the invention and to see how it may be carried out in practice, a preferred embodiment will now be described, by way of non-limiting example only, with reference to the accompanying drawings, in which.

DETAILED DESCRIPTION OF THE INVENTION

Figure 1:
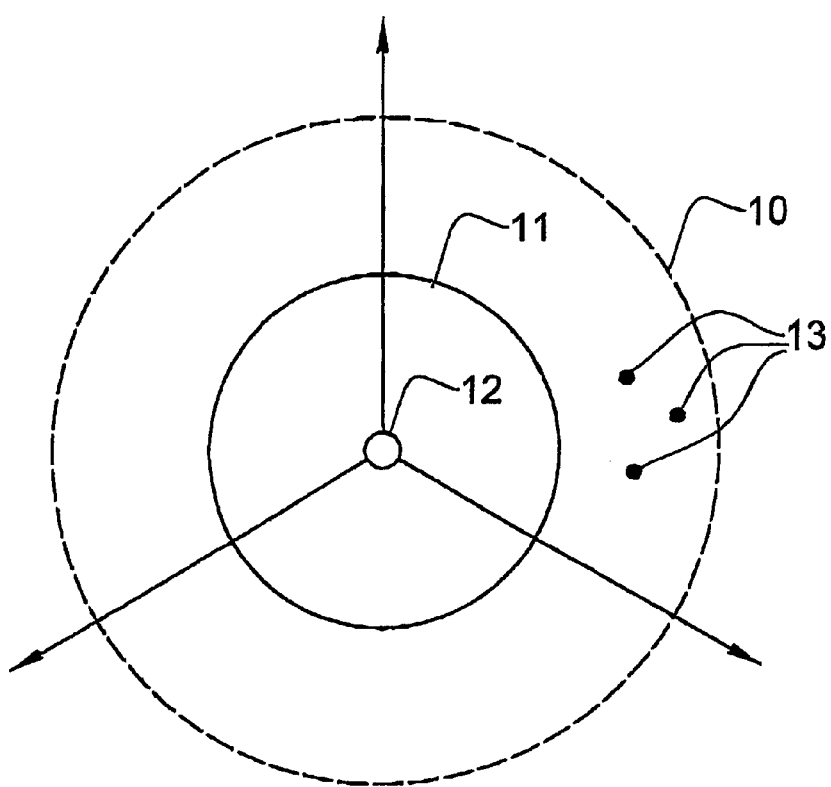
FIG. 1 is a pictorial representation of a prior art exploration procedure, when restrict algorithm is not applied.

FIG. 1 shows pictorially a prior art exploration procedure, having no restrict algorithm, for searching a state space represented by a circle having a circumference 10. The circle of circumference 10 denotes the set of all reachable states. An inner circle having a circumference 11 denotes the set of reachable states explored until encountering the explosion problem—i.e. the computer runs out of memory for storing subsequent reachable states. The search starts at the set of initial states depicted by the inner circle having circumference 12 and proceeds along iteratively searching for reachable states. The exploration stops when either the entire space-state was explored or when the state-space problem is encountered depicted in the figure by the circle of circumference 11. It may be the case that the potential design error states, denoted as 13, has not been explored since the state explosion problem was encountered earlier to their exploration.

Figure 2:
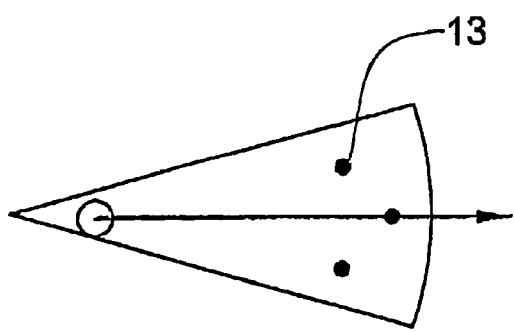
FIG. 2 is a pictorial representation showing the desired reduction in the state-space. When applying the restrict algorithm according to the invention, the desired reduction is achieved.

FIG. 2 shows pictorially the desired reduction in the state-space when applying the restrict algorithm according to the invention. Similar to prior art, the algorithm explores iteratively reachable states starting at the set of initial state. The differences are that the restrict algorithm explores the state-space of the product-machine and that during exploration, states in which the FSM component "misbehaves" are omitted from the state-space (exploration does not proceed from them). Thereby potentially increasing the depth of the explored computation tree, and allowing exploration of states of larger depth, The picture depicts the case in which the potential design error states that were not explored by prior art algorithm, because of their large depth, are explored when the restrict algorithm is used.

Figure 3:
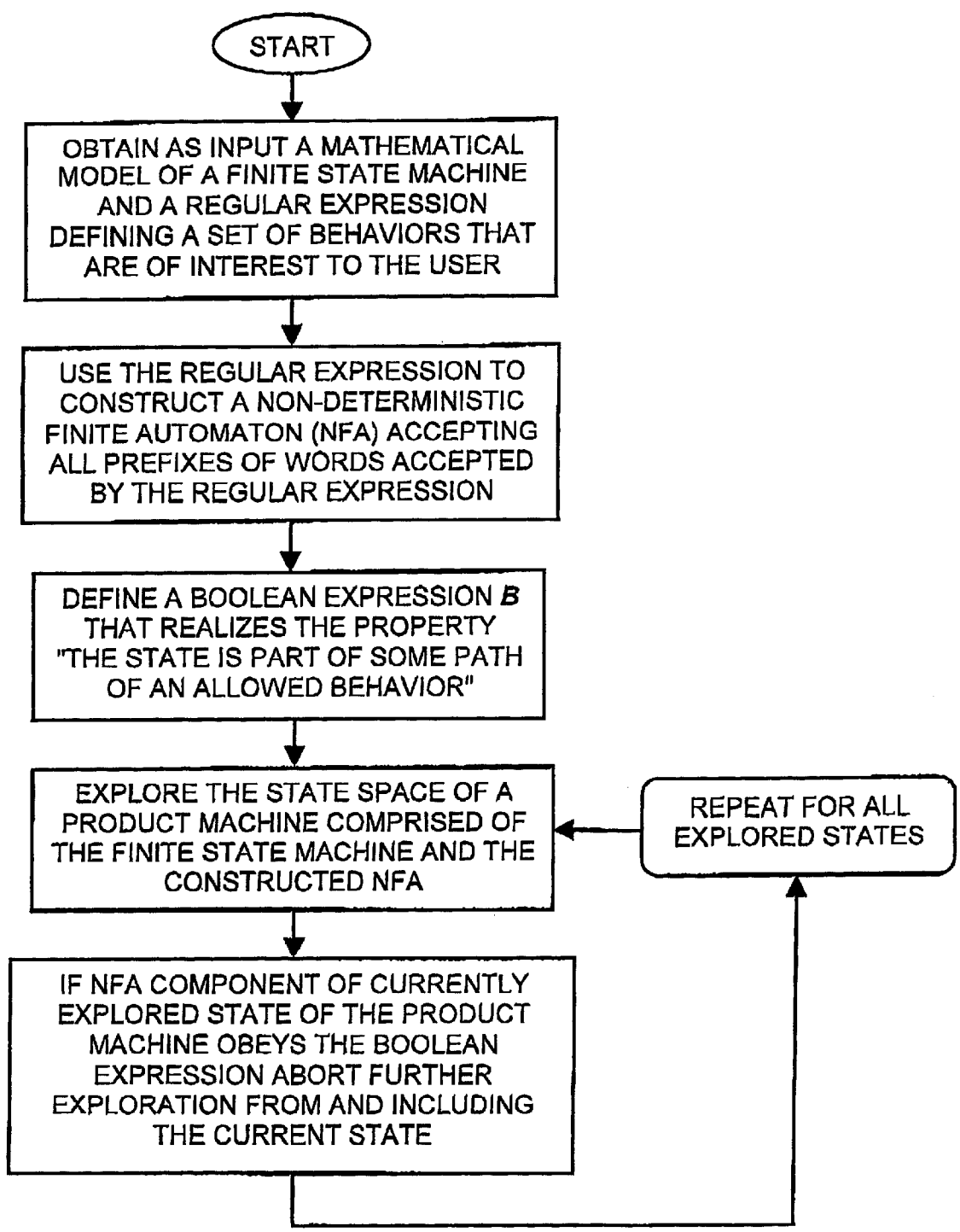
FIG. 3 is a flow diagram showing the principal operating steps associated with a method according to the invention for reducing the state-space of a state machine.

FIG. 3 is a flow chart showing the principal operating steps associated with the algorithm, as follows:

(i) Obtain as input a Mathematical Model of a Finite State Machine and a Regular Expression defining a set of behaviors that are of interest to the user;

ii) Use the Regular Expression to construct a non-deterministic finite automaton (NFA) accepting all prefixes of words accepted by the Regular Expression. In the preferred embodiment, the NFA has a unique characteristic, although any other NFA accepting the designated language can handle the task. This unique characteristic states that for any given state, there exists only one condition to transit out. If this condition holds, the NFA non-deterministically transits to one of various possible states, otherwise it transits to a sink state (the rejecting state);

iii) Let $s_0, s_1, s_2, \ldots s_n$ be the states of the NFA. Let $p_i$ be the condition to transit from the state $s_i$, to some other state (which is not the sink state, $s_0$), and let the Boolean expression $b_i$ denote "the NFA is in state $S_i$". The following Boolean expression:

$$B = (\vee_{1 \leq i \leq n}(b_i \hat{\ } p_i))$$

will evaluate to true if the NFA is in some state which is not the rejecting state, and the condition to transit out from this state holds. Thus, the Boolean expression B realizes the property "the state is part of some path of an allowed behavior". Note that this description suits only the specific implementation of the NFA according to the invention: a Boolean expression realizing the same property can be achieved, with minor modifications, for any other NFA.

(iv) Explore the state space of a product machine comprised of the Finite State Machine and the constructed NFA and for each explored state of the product machine, if the NFA component of the currently explored state of the product machine does not obey the Boolean Expression, then:

(v) abort further exploration from the current state (including the current state).

During step (d), all states explored are intersected with B, resulting in a reduced state-space, lacking all paths that do not obey the behaviors defined by the Regular Expression given the user.

Figure 4:
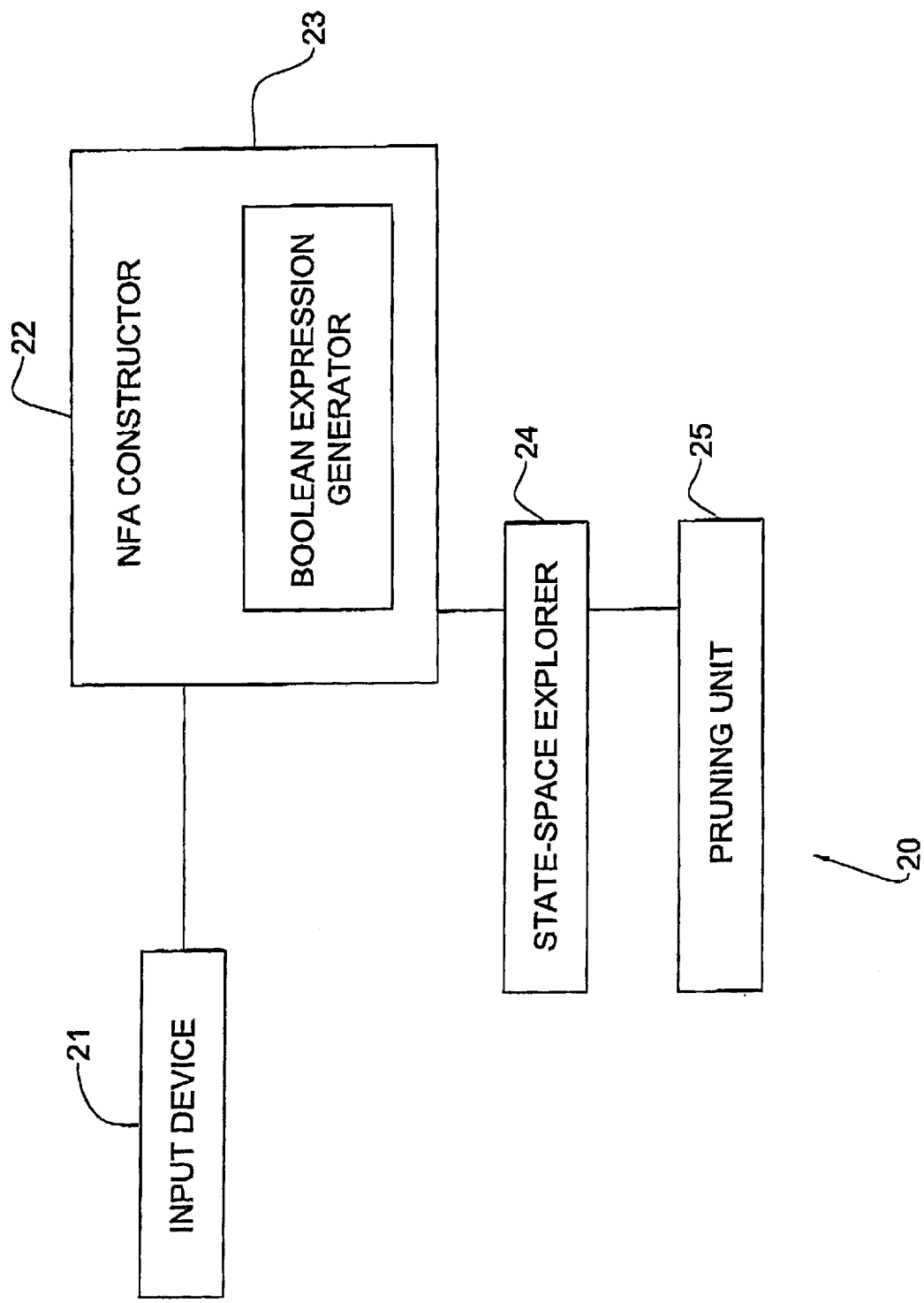
FIG. 4 is a block diagram showing functionally a system according to the invention for reducing the state-space of a state machine.

FIG. 4 is a block diagram showing functionally a system 20 according to the invention for reducing a size of a computation-tree defining a set of reachable states of a state machine of a model. The system 20 comprises an input device 21 for obtaining as input a Finite State Machine and a Regular Expression defining a set of behaviors that are of interest to the user. An NFA constructor 22 is coupled to the input device 21 for using the Regular Expression to construct a non-deterministic finite automaton (NFA) accepting all prefixes of words accepted by the Regular Expression. The NFA constructor 22 is coupled with a Boolean expression generator 23 for constructing a Boolean expression that realizes a property that the state is part of some path of a behavior defined by the Regular Expression, i.e. the expression evaluates to a first logic symbol for each of said words that are defined by the Regular Expression and evaluates to a second logic symbol otherwise. A state-space explorer 24 coupled to the NFA constructor 22 explores a state-space of a product machine comprising the Finite State Machine and the constructed NFA such that for each state of the product machine there exists a corresponding Finite State Machine component and a corresponding NFA component. A pruning unit 25 is coupled to the state space explorer 24 and the boolean expression generator 23, and for each explored state of the product machine, if the NFA component of the currently explored state of the product machine does not satisfy the Boolean Expression, then it pruns the currently explored state from the computation tree so as to abort further exploration from the currently explored state.

Application Description

The restrict scheme applicability is exemplified in the following design. Assume a design consisting of 4 state machines, each capable of handling a single input command at a time. Upon receiving an input command, the design responds in either one of the following two responses:

(i) Accept the input command, and assign a state machine to handle it.

(ii) Reject the input command.

Possible reasons for rejecting the input command include the fact that all four state machines are busy; the input command has the same tag as one of the input commands already handled by one of the four state machines; or some other internal state of the design that does not allow for new input commands to be received. The time required to handle an input command varies. After the assigned state machine finishes servicing the input command, it is ready to receive new input commands.

The set of rules defined to verify the design include formulas that check acceptance and rejection of input commands. The environment supports issuing of up to six input commands, keeping the command's arrival time and tag non-deterministic. In this environment the rules, aiming to check that the design follows its specification, encountered the state explosion problem.

Viewing this result, it was found necessary to restrict the environment, in order to reduce the state-space. The usual approach may suggest reducing the number of possible input commands. However, using this technique militates against verifying the behavior of the design with respect to the scenario of a new input command arrival while all four state machines are busy. A different solution for limiting the environment may be assigning a predetermined timing for some of the input commands, albeit there is no guarantee that the timed input commands will be accepted by one of the design's state machines. The inability to predict the design's behavior in conjunction with the remaining non-deterministic input commands deters the certainty that the desired scenario will occur.

Use of the above-described restrict algorithm makes it possible to limit the environment during the first stages of the state-space exploration by instructing the search algorithm to examine only paths beginning with four consecutive input commands, which are all accepted by the design. The syntax for applying the restrict command is as follows:

restrict {(input_command & accept) [4], true[*]} where (input_command & accept) [4] is an abbreviation for (input_command & accept), (input_command & accept) (input_command & accept), (input_comand & accept).

The usage of the design output accept ensures that only paths where four input commands are accepted will be considered by the search algorithm. Achieving this goal using a standard functional environment description is quite burdensome—it requires the knowledge of all possible sequences leading the design to accept four input commands, which is non trivial. Furthermore, restrict does not impose any limitations on the remaining two input commands—they can arrive at any time, finding the design with 0 to 4 busy state machines.

TABLE I

Experimental Results

| i | No | Yes | 33 | 5,760,670 |
|---|----|-----|-----|-----------|
|   | Yes | No | 85 | 532,675 |
| ii | No | Yes | 133 | 5,500,000 |
|    | Yes | No | 565 | 250,000 |

Table I above summarizes some results achieved when applying the restrict scheme. Row (i) details the results achieved when working on the application described above. Row (ii) details the results of a different design and property, and is given as further means of comparison. The second column from the left indicates whether the restrict algorithm was applied. The third column from the left indicates whether the state-explosion problem was encountered, where we define state-explosion by number of BDD-nodes allocated exceeding 5,000,000. In the forth column we have written the number of iteration calculated by the search algorithm until either the state-explosion problem was encountered (lines 1, 3) or until a bug was found (lines 2, 4).

As can be seen from Table I, both examples emphasize the advantages of the restrict scheme: It allows completion of the verification task while sustaining a model that is 10 to 20 times smaller in size. The restricted model, achieved by using the restrict algorithm, enables a much deeper state exploration (up to 3 times as many iterations), using a much smaller amount of memory.

In summary, the restrict paradigm makes it possible to model check the desired set of rules without encountering the space state explosion problem, by easily directing the search algorithm to paths of interest.

Other Applications

1. Verification at Early stages of the design

At early stages of the design, when parts of the design functionality are not yet implemented, restrict can be used conveniently to avoid model-checking errors that occur because the design is not matured. Suppose, for example, that the design is not yet capable of handling two 'read' signals that occur one right after the other. The user can add the restriction restrict {(!read[*], {read, !read[+]}[*], !read [*]}, where read[+] is an abbreviation for read, read[*], thus guiding the search only to paths in which two 'read's do not occur consecutively.

2. Verifying correction of a previously detected bug

Restrict may be used as a mean to prove that a previously detected bug has been corrected: Given a rule in which one of the formulas failed, a counter example trace is produced. After assuring that the fail is not due to erroneous modeling, the trace is presented to the designer who is responsible for the fix. With the designer's correction in place, it is now necessary to verify that the problem has been fixed. As a first measure for the validity of the correction, it should be assured that the trace produced earlier as a counter example is no longer a legitimate path. Restrict mechanism can achieve this goal swiftly and efficiently.

The counter example trace is coded as a regular expression, <trace-reg-expr>. To be precise, only inputs appearing in the trace are coded by the regular expression, in order to avoid enforcing the design to be exactly in the same internal states. The rule is now run again, with an additional constraint in the form of restrict {<trace-reg-expr>}. In case that the designer's fix were incorrect, the restrict algorithm forces the trace appearing as a counter example to be the same as the original one.

Had the restrict algorithm not been used, a full state-space exploration would have been conducted, consuming valuable time. Revalidating the rule using restrict algorithm also prevents the user from straying to related and follow-up problems, before fully answering the issue at hand. The invention thus introduces a new concept lying within the description of the model by declarative means, via regular expressions, rather than the traditionally used functional model description by state machines. This innovation holds the key for greater succinctness and ease of expression. Succinctness as a description by regular expression is in many cases much shorter than a description via state machines. Ease of expression follows from the fact that one has to describe how the model should behave without implementing such a behavior.

It will be understood that the system according to the invention may be a suitably programmed computer. Likewise, the invention contemplates a computer program being readable by a computer for executing the method of the invention. The invention further contemplates a machine-readable memory tangibly embodying a program of instructions executable by the machine for executing the method of the invention.

It will be apparent to those skilled in the art that modifications may be made to the preferred embodiment without departing from the scope of the appended claims. Thus, whilst in the preferred embodiment, the mechanism identifies states in the computation tree that are part of one of the desired behaviors, an alternative mechanism may identify those states that are not part of any of the desired behaviors so as to continue exploration only of the remaining states.

Likewise, whilst in the preferred embodiment a non-deterministic finite automaton is employed, it will be appreciated that a deterministic finite automaton can also be used, albeit less effectively.

In the method claims that follow, alphabetic characters used to designate claim steps are provided for convenience only and do not imply any particular order of performing the steps.

What is claimed is:

1. A computer-implemented method for pruning a computation-tree defining a set of model behaviors of a state machine to a subset of the model behaviors, thereby reducing a complexity of the computation-tree and allowing analysis thereof by a computer in a shorter calculation time than would be possible for the complete computation-tree, said method comprising the steps of:
   (a) obtaining as input:
      i) a Finite State Machine, and
      ii) a Regular Expression defining a set of behaviors that are of interest to the user,
   (b) using the Regular Expression to construct:
      i) a finite automaton accepting all prefixes of words accepted by the Regular Expression, and
      ii) a Boolean expression that realizes a property that the state is part of some path of a behavior defined by the Regular Expression and evaluates to a first logic state for each of said words that are allowable according to the Regular Expression and evaluates to a second logic state otherwise, and
   (c) exploring the state space of a product machine comprising the Finite State Machine and the constructed finite automaton such that for each state of the product machine there exists a corresponding Finite State Machine component and a corresponding finite automaton component, and for each explored state of the product machine, if the finite automaton component of a currently explored state of the product machine does not satisfy the Boolean Expression, then:
   (d) pruning the currently explored state from the computation tree so as to abort further exploration from the currently explored state.

2. The method according to claim 1, wherein the finite automaton is non-deterministic.

3. Use of the method according to claim 1, for model checking an immature design represented by the state machine only some of whose functionalities are implemented, by defining the Regular Expression to describe only those behaviors corresponding to the functionalities that are to be implemented.

4. Use of the method according to claim 1, wherein the Regular Expression is defined to describe a specific path that is not allowable according to a specification of a design represented by the state machine in order to verify that said path is not implemented.

5. The method according to claim 1, wherein the specific path is a counter example of a previously detected bug in the design.

6. A computer program storage device readable by machine, tangibly embodying a program of instructions executable by the machine to perform method steps for pruning a computation-tree defining a set of model behaviors of a state machine to a subset of the model behaviors, thereby reducing a complexity of the computation-tree and allowing analysis thereof by a computer in a shorter calculation time than would be possible for the complete computation-tree, said method comprising the steps of:
   (a) obtaining as input:
      i) a Finite State Machine, and
      ii) a Regular Expression defining a set of behaviors that are of interest to the user,
   (b) using the Regular Expression to construct:
      iii) a finite automaton accepting all prefixes of words accepted by the Regular Expression, and
      iv) a Boolean expression that realizes a property that the state is part of some path of a behavior defined by the Regular Expression and evaluates to a first logic state for each of said words that are allowable according to the Regular Expression and evaluates to a second logic state otherwise, and
   (c) exploring a state space of a product machine comprising the Finite State Machine and the constructed finite automaton such that for each state of the product machine there exists a corresponding Finite State Machine component and a corresponding finite automaton component, and for each explored state of the product machine, if the finite automaton component of a currently explored state of the product machine does not satisfy the Boolean Expression, then:
   (d) pruning the currently explored state from the computation tree so as to abort further exploration from the currently explored state.

7. A computer program product comprising a computer useable medium having computer readable program code embodied therein for pruning a computation-tree defining a set of model behaviors of a state machine to a subset of the model behaviors, thereby reducing a complexity of the computation-tree and allowing analysis thereof by a computer in a shorter calculation time than would be possible for the complete computation-tree, said computer program product comprising:
   computer readable program code for causing the computer to obtain as input:
      i) a Finite State Machine, and
      ii) a Regular Expression defining a set of behaviors that are of interest to the user,
   computer readable program code for causing the computer to use the Regular Expression to construct:
      i) a finite automaton accepting all prefixes of words accepted by the Regular Expression, and
      ii) a Boolean expression that realizes a property that the state is part of some path of a behavior defined by the Regular Expression and evaluates to a first logic state for each of said words that are allowable according to the Regular Expression and evaluates to a second logic state otherwise, and
   computer readable program code for causing the computer to explore a state space of a product machine age comprising the Finite State Machine and the constructed finite automaton such that for each state of the product machine there exists a corresponding Finite State Machine component and a corresponding finite automaton component, and for each explored state of the product machine, if the finite automaton component of a currently explored state of the product machine does not satisfy the Boolean Expression, pruning the currently explored state from the computation tree so as to abort further exploration from the currently explored state.

8. A system for pruning a computation-tree defining a set of model behaviors of a state machine to a subset of the model behaviors, thereby reducing a complexity of the computation-tree and allowing analysis thereof by a computer in a shorter calculation time than would be possible for the complete computation-tree, said system comprising:
   an input device for obtaining as input:
      i) a Finite State Machine, and
      ii) a Regular Expression defining a set of behaviors that are of interest to the user,
   an finite automaton constructor coupled to the input device for using the Regular Expression to construct a finite automaton accepting all prefixes of words accepted by the Regular Expression, a Boolean expression constructor coupled to the input device for using the Regular Expression to construct a Boolean expression that realizes a property that the state is part of some path of a behavior defined by the Regular Expression and evaluates to a first logic state for each of said words that are allowable according to the Regular Expression and evaluates to a second logic state otherwise, a state space explorer for exploring a state space of a product machine comprising the Finite State Machine and the constructed finite automaton such that for each state of the product machine there exists a corresponding Finite State Machine component and a corresponding finite automaton component, and a pruning unit coupled to the state space explorer and, for each explored currently state of the product machine, responsive to the finite automaton component of the currently explored state of the product machine not satisfying the Boolean Expression, for pruning the currently explored state from the computation tree so as to abort further exploration from the currently explored state.

9. Use of the system according to claim 1, for model checking an immature design represented by the state machine only some of whose functionalities are implemented, by defining the Regular Expression to describe only those behaviors corresponding to the functionalities that are to be implemented.

10. The system according to claim 1, wherein the Regular Expression is defined to describe a specific path that is not allowable according to a specification of a design represented by the state machine in order to verify that said path is not implemented.

11. The system according to claim 1, wherein the specific path is a counter example of a previously detected bug in the design.

* * * * *

UNITED STATES PATENT AND TRADEMARK OFFICE
CERTIFICATE OF CORRECTION

PATENT NO. : 6,715,107 B2
DATED : March 30, 2004
INVENTOR(S) : Ilan Beer et al.

It is certified that error appears in the above-identified patent and that said Letters Patent is hereby corrected as shown below:

Column 10,
Line 42, after "machine" delete "age".

Signed and Sealed this

Sixth Day of July, 2004

JON W. DUDAS
*Acting Director of the United States Patent and Trademark Office*